(12) United States Patent
Hamilton et al.

(10) Patent No.: US 6,512,701 B1
(45) Date of Patent: Jan. 28, 2003

(54) ERASE METHOD FOR DUAL BIT VIRTUAL GROUND FLASH

(75) Inventors: Darlene G. Hamilton, San Jose, CA (US); Kulachet Tanpairoj, Palo Alto, CA (US); Yider Wu, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/886,861

(22) Filed: Jun. 21, 2001

(51) Int. Cl.⁷ .............................................. G11C 16/04
(52) U.S. Cl. ........................... 365/185.29; 365/185.03; 365/185.18; 365/185.19; 365/185.33
(58) Field of Search ....................... 365/185.03, 185.18, 365/185.19, 185.29, 185.3, 185.33, 185.14

(56) References Cited

U.S. PATENT DOCUMENTS

| | | | |
|---|---|---|---|
| 5,126,808 A | 6/1992 | Montalvo et al. ........... 357/23.5 |
| 5,463,587 A | * 10/1995 | Maruyama ................... 365/184 |
| 5,561,620 A | 10/1996 | Chen et al. .................. 365/218 |
| 5,598,369 A | 1/1997 | Chen et al. ............. 365/185.27 |
| 5,675,537 A | 10/1997 | Bill et al. ............... 365/185.22 |
| 5,793,079 A | 8/1998 | Georgescu et al. ......... 257/316 |
| 5,793,249 A | 8/1998 | Chen et al. .................. 327/561 |
| 5,815,439 A | 9/1998 | Korsh et al. ............ 365/185.24 |
| 5,875,128 A | 2/1999 | Ishizuka ................ 565/185.06 |
| 5,963,477 A | 10/1999 | Hung ..................... 365/185.22 |
| 5,991,206 A | 11/1999 | Shin ....................... 365/185.29 |
| 6,011,725 A | 1/2000 | Eitan ...................... 365/185.33 |
| 6,043,530 A | 3/2000 | Chang ......................... 257/320 |
| 6,147,906 A | * 11/2000 | Bill et al. ............... 365/185.14 |
| 6,285,599 B1 | * 9/2001 | Shimada et al. ......... 365/185.22 |
| 6,330,184 B1 | * 12/2001 | White et al. ............ 365/185.03 |
| 6,356,482 B1 | * 3/2002 | Derhacobian et al. . 365/185.03 |

* cited by examiner

Primary Examiner—Michael S. Lebentritt
Assistant Examiner—Van Thu Nguyen
(74) Attorney, Agent, or Firm—Amin & Turocy, LLP

(57) ABSTRACT

A system and methodology is provided for verifying erasure of one or more dual bit virtual ground memory cells in a memory device, such as a flash memory. Each of the dual bits have a first or normal bit and a second or complimentary bit associated with the first or normal bit. The system and methodology include verifying and erasure of both a normal bit and a complimentary bit of the cell. The erasure includes applying a set of erase pulses to the normal bit and complimentary bit in a single dual bit cell. The set of erase pulses is comprised of a two sided erase pulse to both sides of the bits in the cell or transistor junction followed by a first single sided erase pulse to one side and a second single sided erase pulse to the other side of transistor junction.

41 Claims, 12 Drawing Sheets

ERASE METHOD FOR DUAL BIT VIRTUAL GROUND FLASH

FIELD OF INVENTION

The present invention relates generally to memory systems and in particular to systems and methods for programming and erasing sectors of bits in an electronic flash memory device having dual bit memory transistor cells using virtual ground architecture.

BACKGROUND OF THE INVENTION

Flash memory is a type of electronic memory media which can be rewritten and hold its content without power. Flash memory devices generally have life spans from 100K to 300K write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal connected to a different word line, while all the flash cells in the array have their source terminals connected to a common source terminal. In operation, individual flash cells are addressed via the respective bit line and word line using peripheral decoder and control circuitry for programming (writing), reading or erasing functions.

Such a single bit stacked gate flash memory cell is programmed by applying a voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a voltage is applied to the source, and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells, which fail the initial verification. Thereafter, the erased status of the cell is again verified, and the process continues until the cell or bit is successfully erased or the cell is marked as unusable.

Recently, dual bit flash memory cells have been introduced, which allow the storage of two bits of information in a single memory cell. The conventional programming and erase verification methods employed with single bit stacked gate architectures are not adequate for such dual bit devices. Recently, dual bit flash memory structures have been introduced that do not utilize a floating polysilicon gate, such as an ONO flash memory device that employs a polysilicon layer over the ONO layer for providing wordline connections. Conventional techniques do not address the characteristics associated with these types of devices. Therefore, there is an unmet need in the art for new and improved erase methods and systems, which ensure proper erasure of data bits in a dual bit memory virtual ground architecture, and which account for the structural characteristics thereof.

SUMMARY OF THE INVENTION

A system and methodology is provided for verifying erasure of one or more dual bit virtual ground memory cells in a memory device, such as a flash memory. Each of the dual bits are provided with a first or normal bit and a second or complimentary bit associated with the normal bit. Both bits are contained within the same transistor. The invention allows for efficient and thorough erasure and verification, which minimizes data retention and over-erase issues similar to those caused in an ONO single bit cell architecture. The invention provides significant advantages when employed in association with dual bit memory cells formed from an ONO architecture. However, it will be recognized that the invention finds utility in association with dual bit memory cell architectures generally, and that the invention is thus not limited to any particular dual bit cell usage implementation or configuration. Although, charge associated with programming of a single bit in the dual bit memory cell is isolated, it causes the associated cell to program harder making it more difficult to erase. For example, residual charge can be accumulated into the central region of the cell, which cannot be erased by a normal erasure of the bit by itself. Therefore, the system and methodology includes verifying and erasure of both a normal bit and a complimentary bit of the cell, which are opposite sides of the same ONO transistor. The erasure includes applying a set of erase pulses to the normal bit and complimentary bit in a single dual bit cell. The set of erase pulses is comprised of a two sided erase pulse to both sides of the transistor followed by a single sided erase pulse to one side and a single sided erase pulse to the other side.

In one aspect of the invention, a system and method is provided for verify erasure of a memory array of dual bit flash memory cells. The system and method include preprogramming of bits in both normal column locations and complimentary column locations and then verify erasure of both bits in normal and complimentary bit column locations. The verify erasure requires that each bit address location pass the erase verify before moving to the next address. Alternatively, the erase verify can be performed on a I/O or word of bits such that the normal bits and complimentary bits of an I/O have to pass before moving on to the next I/O or word. If an address location is not below a maximum VT defining a blank state, a set of erase pulses is applied. The set of erase pulses include a two sided erase pulse to bits in normal and complimentary column locations for a specified duration (e.g., 10 ms) followed by a first single sided erase pulse to bits in one of the normal column locations and complimentary column locations for a specified duration (e.g., 1 ms) and a second single sided erase pulse to bits in the other of the normal column locations and complimentary column locations for a specified duration (e.g., 1 ms). The steps of verifying and erasure are repeated until each normal bit and complimentary bit in a sector are below the maximum VT defining a blank cell. The steps are then repeated for each sector.

The bits are then evaluated to determine if the bits have been over-erased or fall below a minimum VT defining a blank cell. A soft program pulse is provided for the bits determined to have been over-erased. The soft program verify should include a low level source voltage to shutoff the leakage from other cells on the same column. A second or final routine of verify erasure is performed on both the bits in the normal column locations and the complimentary column locations to assure that the soft program pulse did not cause the bits to rise above the maximum VT defining a blank cell.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
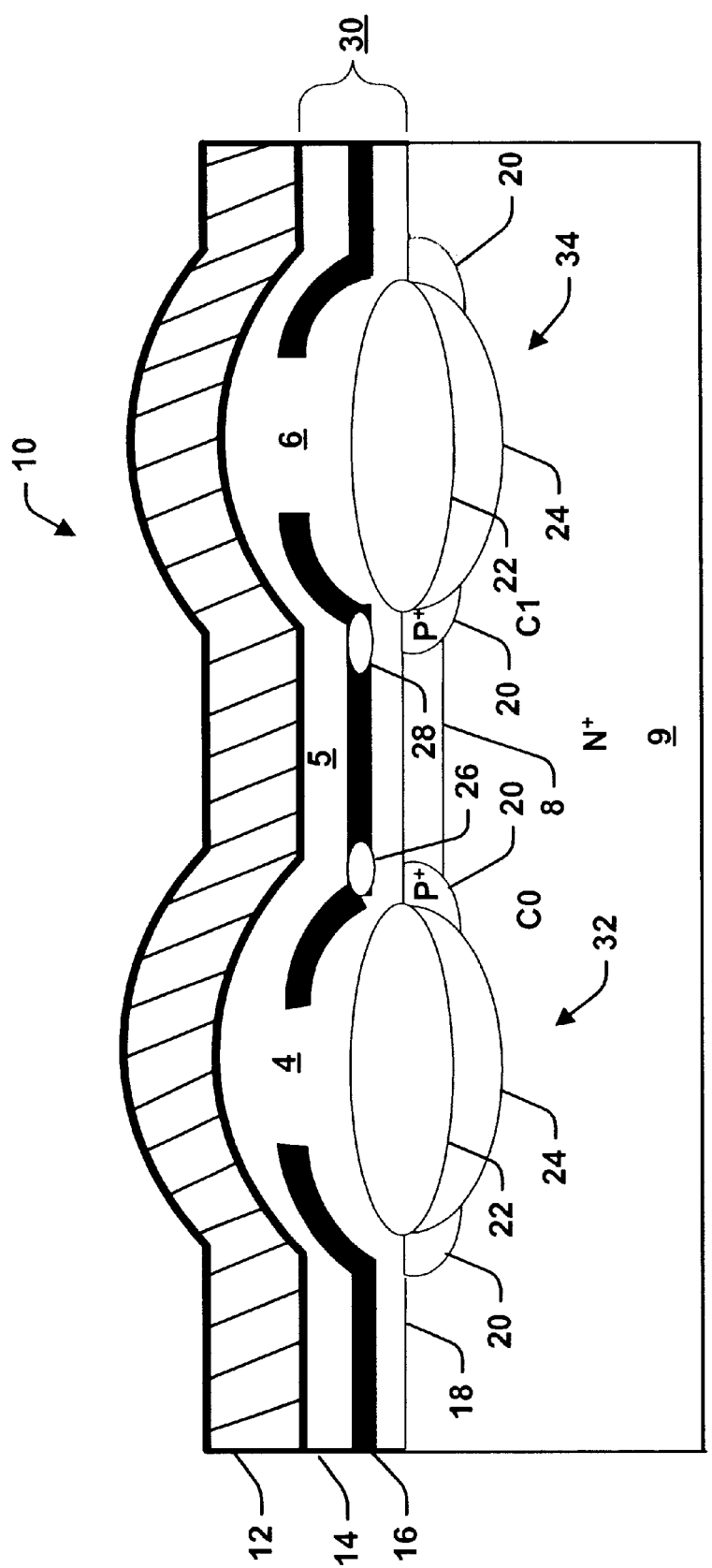
FIG. 1 is a side cross-sectional view of an exemplary dual bit memory cell in which various aspects of the present invention may be implemented.

The following is a detailed description of the present invention made in conjunction with the attached figures, wherein like reference numerals will refer to like elements throughout. The invention provides methodologies and a system for programming (writing), verifying (reading) and proper erasure of dual bit memory cells operating in a double or dual bit mode. The present invention may be used in conjunction with a chip erase or sector erase operation in a flash memory device. Furthermore, the present invention provides methodologies and a system for proper arrangement and maintenance of dual bit memory cells in an array operating in double bit mode. Although the invention is hereinafter illustrated and described in association with an ONO dual bit memory cell architecture wherein both bits of each cell are used for data storage, it will be appreciated that the invention is applicable to other type architectures and other dual bit architecture usage schemes.

Referring now to the drawings, FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the biltines meets the bottom silicon dioxide layer 18 or along the entire transistor. The boron core implants are more heavily doped than the P-type substrate and assist in control of the VT of the memory cell 10. The cell 10 resides on a P-type substrate 9 with the conductive portion 24 of the bitlines 32 and 34 being formed from an N+ arsenic implant, such that a channel 8 is formed between across the P-type substrate. The memory cell 10 is comprised of a single transistor having interchangeable source and drain components formed from the N+ arsenic implant portions 24 residing on the P-type substrate region 9 with a gate formed as part of a polysilicon wordline 12.

Although the first and second bitlines 32 and 34 are illustrated with respect to a conductive portion 24 and an optional oxide portion 22, it is appreciated that the bitlines can be formed from a conductive portion only. Furthermore, although the drawing of FIG. 1 illustrates gaps in the silicon nitride layer 16, it is to be appreciated that the silicon nitride layer 16 may be fabricated with out gaps as a single strip or layer.

The silicon nitride layer 16 forms a charge trapping layer. Programming of the cell is accomplished by applying voltages to the drain and the gate while grounding the source. The voltages generate electrical fields along the channel causing electrons to accelerate and jump from the substrate layer 9 into the nitride which is known as hot electron injection. Since the electrons gain the most energy at the drain, these electrons become trapped and remain stored in the nitride layer near the drain. The cell 10 is generally uniform and the drain and source are interchangeable. Since the silicon nitride is non-conducting, a first charge 26 can be injected into the nitride 16 near a first end of the central region 5 and a second charge 28 can be injected into the nitride 16 near a second end of the central region 5. Therefore, if the charge does not move then there can be two bits per cell instead of one bit.

As previously stated, the first charge 26 can be stored in the nitride layer 16 at the first end of the central region 5 and the second charge 28 can be stored at the second end of the central region 5 such that two bits can reside per memory cell 10. The dual bit memory cell 10 is generally symmetrical, thus the drain and the source are interchangeable. Thus, the first bitline 32 may serve as the drain terminal and the second bitline 34 as the source terminal when programming the left bit C0. Likewise, the second bitline 34 may serve as the drain terminal and the first bitline 32 as the source terminal for programming the right bit C1. Table 1 illustrates one particular set of voltage parameters for performing reading, programming and single sided erases of the dual bit memory cell 10 having the first bit C0 and the second bit C1.

TABLE I

| Operation | Cell | Gate | Bitline 0 | Bitline 1 | Comment |
|---|---|---|---|---|---|
| read | C0 | Vcc | 0 v | 1.2 v | complimentary column |
| read | C1 | Vcc | 1.2 v | 0 v | normal column |
| program | C0 | Vpp | 5–6 v | 0 v | hot electron |
| program | C1 | Vpp | 0 v | 5–6 v | hot electron |
| One side-erase | C0 | –3 to –6 v | 5–6 v | Float | hot hole injection |
| One side-erase | C1 | –3 to –6 v | Float | 5–6 v | hot hole injection |
| Two side-erase | C1, C0 | –3 to –6 v | 5–6 v | 5–6 v injection | hot hole |

Various implementations of dual bit memory cell architecture may be achieved according to one or more aspects of the present invention. In particular, the invention is applicable to memory devices wherein both bits in a dual bit cell are used for data or information storage. The inventors of the present invention have found that program and erasure of one bit (e.g., bit C0) in such a cell effects the programming and/or erasure of its associated bit (e.g., bit C1). For example, repeated programming of bit C1 of cell 10 may cause charge accumulation in bit C0 and vice versa. Also, repeated application of erase voltage pulses to bit C1 may cause over erasure of bit C0. These phenomena in the associated bit C0 may in turn cause degradation with respect to the operation of the bits during normal operation (e.g., the ability to effectively read, write/program, and/or erase one or both bits). The invention addresses these problems with respect to dual bit memory cell technology by selectively programming, verifying, erasing, and re-verifying the individual bits of such memory cells in order to further ensure the proper erasure of the memory cell, for example, in a block or sector erase operation in a flash memory device.

Figure 2:
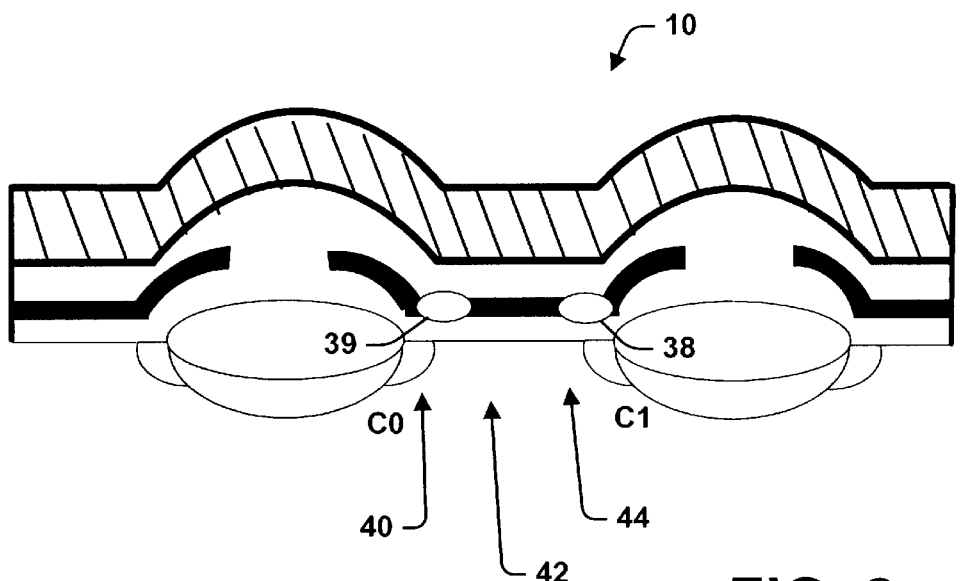
FIG. 2 is a side cross sectional view of the dual bit memory cell illustrating the storing of a programmed charge in a normal region and a complimentary region of the dual bit memory cell.

FIG. 2 illustrates the programming of both bits in the memory cell 10. For purposes of explanation one bit will be referred to as the normal bit (NB), while the associated bit will be referred to as the complimentary bit (CB). During read operations, the junction nearest the cell being read is the ground terminal and the other side of the transistor is the drain. This is called reverse read. The drain is switched during programming and erase back to the nearest junction being the drain voltage instead of ground, which is used for read and verify operations.

The dual bit memory cell 10 may be considered as three individual pieces acting together which are a complimentary bit region 40, a central region 42 and a normal bit region 44. The complimentary bit region 40 and the normal bit region 42 are near the drain/source junctions and the local VT can be modified during programming and erase operations. The central region 42 should be close to the natural VT generated in the fabrication process of the memory cell 10. The silicon nitride 16 from the ONO stack 30 is used to store a first charge 38 in the normal region 44 and a second charge 39 in the complimentary bit region 40. Since nitride is not a conductor, the charge added or removed during the program and erase operations should not redistribute itself but should remain where it is originally injected. This means each side of the transistor can have different charge and different VT almost independent of the other side. For example, if the natural or erase/blank VT of the CB and NB is approximately 1.2V and if the NB is programmed to a VT of approximately 3.8V, the CB should still be close to the blank state. Furthermore, if both bits are programmed to a VT of 3.8V and then the NB is erased then the CB should be at approximately 3.8V and the NB at approximately 1.2V.

Figure 3:
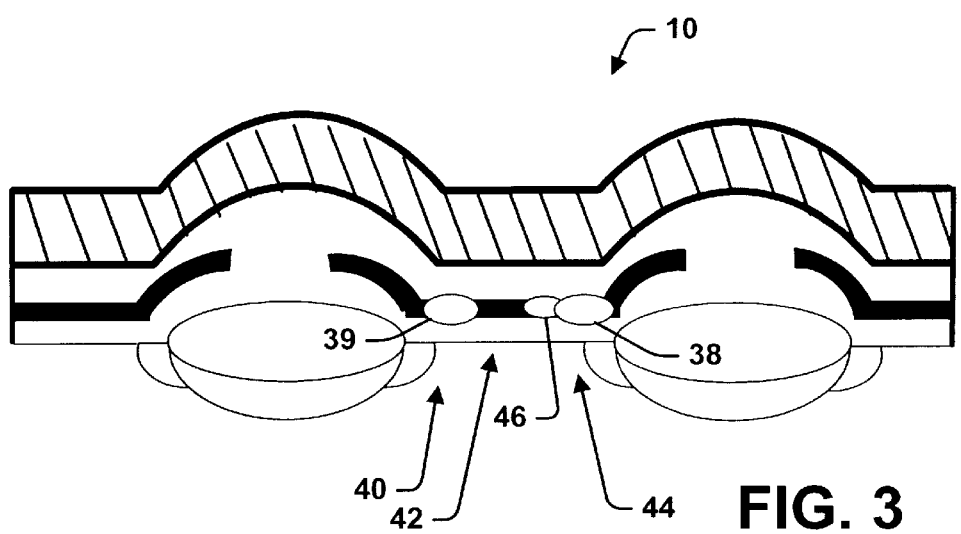
FIG. 3 is a side cross sectional view of the dual bit memory cell illustrating non-uniform charge accumulation into a central region of the cell due to the over-programming of the second bit programmed of the dual bit memory cell.
Figure 4:
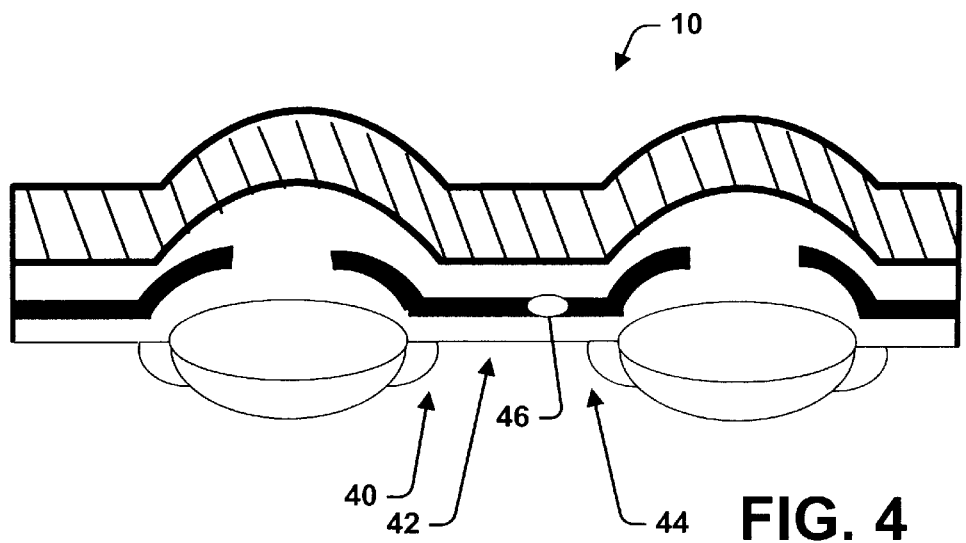
FIG. 4 is a side cross sectional view of the dual bit memory cell illustrating residual charge remaining in the central region of the cells near the array edges after erasure of the cell using only the one sided or two sided erase.

Additionally, during the read operation for the NB, part of the charge near the CB bitline should be covered by a drain depletion region since the source (ground) is always on the junction nearest the cell being verified. This is called reverse read operation since the verified cell's junction is grounded. Although, the reverse read method covers up some of the charge near the other bits's junction, any charge in the center of the channel will modify the effective VT of both the CB and the NB. As one of the areas becomes higher or lower in VT, the other regions can also be effected since they are all part of the same transistor. FIG. 3 illustrates how programming of the NB with programming charge 38 into the NB region 44, after the CB has already been programmed with similar program parameters, can cause a buildup of charge 46 to escape partially into the central region 42. This additional charge in the second bit programmed is due to an effective shorter channel while programming the second bit. The effective shorter channel is due to the charge stored on the first bit near the junction which is grounded during programming of the second bit. As illustrated in FIG. 4, the buildup of charge 46 may remain in the cell 10 and change the programming and erase characteristics of the cell 10 during each cycle. The location of the additional second bit programmed charge 46 changes the effective VT of the CB region 40 and the NB region 44 and causes the erase time to increase as the number of program and erase cycles increase. The combination of two sided and one sided erase steps provide a stable method to control the dual bit erase for the typical and outer most bits of the array populations. The outer most bits of the array population are usually different in channel length or width and erase much slower using the two sided only method, but typical cells erase best with the two sided erase pulses. Therefore, the one sided erase was added to maintain the erase speed of the outer most bits of the population.

Figure 5:
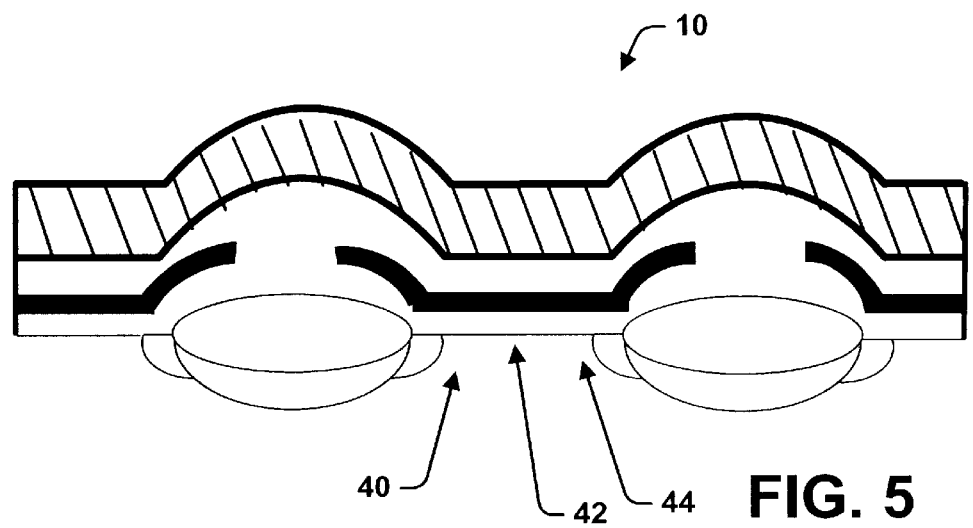
FIG. 5 is a side cross sectional view of the dual bit memory cell illustrating removal of the residual charge remaining in the central region of the cell near the array edges after erasure of the dual bit memory cell in accordance with the present invention.

Therefore, it is important to make sure that the VT of the NB region 44, the central region 42 and the CB region 40 are monitored and maintained at known levels in order to operate the memory cell correctly. Typically, the process of monitoring and controlling the VT of the CB and NB occurs during erase (hereinafter referred to as "the doubled bit erase"). Therefore, in the present invention the erase is performed to ensure that the residual charge in the central region 42 is controlled. By controlling the VT distributions during erase, both the erase and program times remain stable during program and erase cycling. FIG. 5 illustrates the memory cell 10 after a programming and erase cycle employing the double bit erase methodology of the present invention.

Many flash memories are provided with command logic and embedded state machines which perform the complex programming and erasing operations automatically. A static random access memory (SRAM) module component may include the programs implemented by a micro-controller for use in controlling the operations of command logic and the memory system. These programs are typically loaded into an SRAM when a system is powered up. A bus can be used to send control commands from a processor to the command logic device and to exchange the data read from or written to the flash memory device with the command logic and a host processor. The embedded state machines of the flash device generate the command logic controls for detailed operations such as the various individual steps necessary for carrying out programming, reading and erasing operations. The state machine thus functions to reduce the overhead required of a processor (not depicted) typically used in association with a microchip containing the flash memory.

Figure 6:
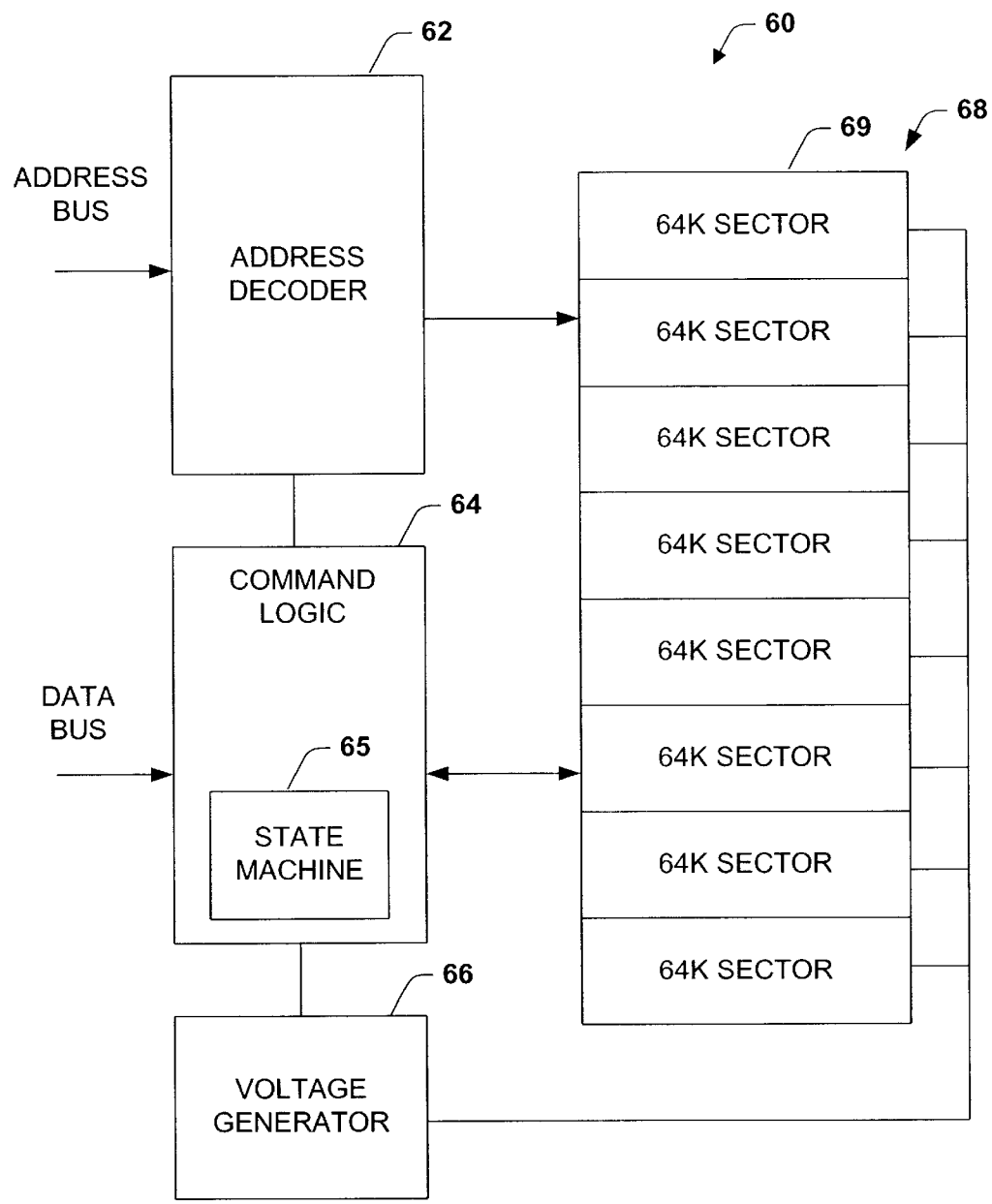
FIG. 6 illustrates a block schematic diagram of a system adapted to carry out various aspects of the invention.

Referring now to FIG. 6, a system 60 is provided for performing programming, verifying, soft programming and erasing of a memory array 68 employing the dual bit memory cells of the present invention. In the present example, the memory array 68 is comprised of a plurality of 64K sectors 69. A sector of the flash memory array 69 includes a portion of the memory array 68 consisting of all the memory cells grouped together via all the wordlines that share the same sector address. The sector address is typically the n (e.g., six) most significant address bits of the address bit signals used to address one or more cells in the memory device where n is an integer. For example, each 64K sector 69 can be comprised of 8 IOs where an IO is a row of 4 cells or 4 dual bit memory cells having 4 normal bits and 4 complimentary. It is to be appreciated that the memory array 68 could be any number of different configurations, for example, 128K sectors comprised of 8 normal bits and 8 complimentary bits on 8 cells. In addition any number of sectors may be employed only limited by the size of the application and the size of the device employing the flash memory array 68.

The system 60 includes an address decoder 62 connected to the flash memory array 68 for decoding IOs during various operations that are performed on the array 68 (e.g., programming, reading, verifying, erasing). The address decoder receives address bus information from a system controller (not shown) or the like.

A command logic component 64 includes an internal state machine 65. The command logic component 64 is connected to the address memory array 68. The command logic and state machine receive commands or instructions from a databus connected to a system controller or the like. The commands or instructions invoke algorithms embedded in the command logic 64 and state machine 65. The algorithms perform the various methodologies of programming, reading, erasing, soft programming and verifying to be described herein. A voltage generator component 66 is also connected to the memory array 68 and the command logic 64 and state machine 65. The voltage generator component 66 is controlled by the command logic 64 and state machine 65. The voltage generator component 66 is operable to generate the necessary voltages for programming, reading, erasing, soft programming and verifying of the memory cells of the memory array 68.

Figure 7:
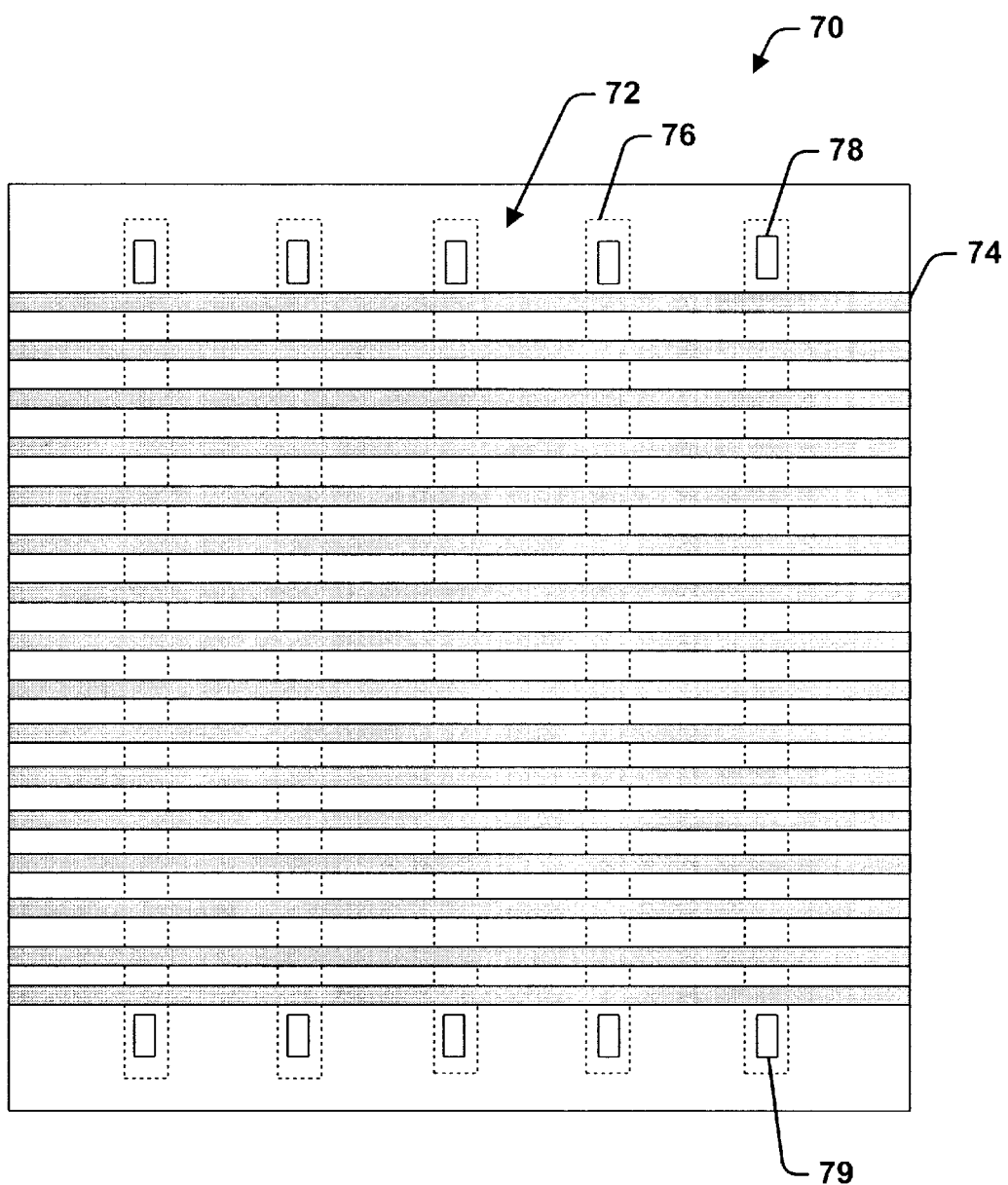
FIG. 7 illustrates a partial top view of a 64K sector of an array of dual bit flash memory having 16 words of 16 bit memory in accordance with the present invention.

FIG. 7 illustrates a partial memory cell layout from a top or plan view of an example of a 64K block 70. The present example is illustrated with respect to a 64K block of 16 bit I/Os. It is to be appreciated that blocks may be 8 bit, 32 bit, 64 bit or more I/Os and are not limited to 64K (e.g., 128K, 256K, etc.). The 64K block 70 can be a sector or a portion of a sector. For example, one or more blocks with the contacts connecting common metal bitlines can form a sector. An ONO stack strip or layer 72 extends the length of the memory array and includes the block 70. The block 70 includes 16 I/Os or groups of columns 79. Each "word" or group of IO's is comprised of eight transistors or eight normal bits and eight complimentary bits. Each I/O includes a polysilicon wordline 74 for addressing the rows of cells. A plurality of bit lines run underneath the ONO stack strip layer 72 for enabling reading, writing and erasing of individual bits of the memory cells. Each bitline is connected to a first contact 78 and metal bitlines (not shown) at one end of a group of sixteen rows and a second contact 79 at the other end of the group. In the example of FIG. 7, five bit lines are illustrated such that a bitline is tied to an end of every other transistor in a column and two select transitors are used to select between four bits of two transistors for reading, writing and erasing.

Figure 8:
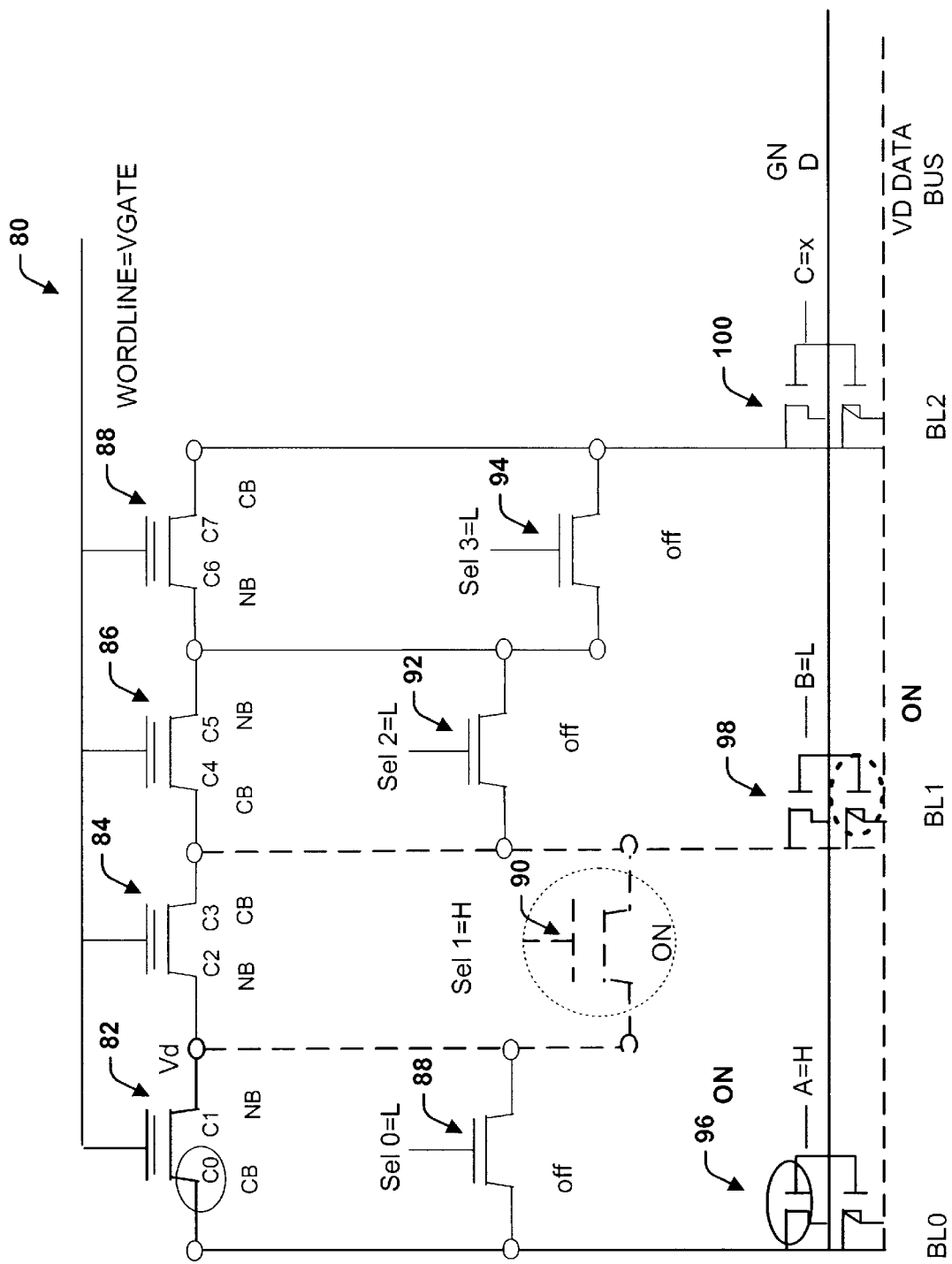
FIG. 8 illustrates a schematic view of a portion of a row of dual bit memory cells in accordance with the present invention.

FIG. 8 illustrates a schematic diagram of addressing of the first four dual bit memory cells in a row utilizing selection transistors and three bitlines for reading, writing and erasing bits. A first dual bit memory cell 82 includes a first bit C0 and a second bit C1, a second dual bit memory cell 84 includes a first bit C2 and a second bit C3, a third dual bit memory cell 86 includes a first bit C4 and a second bit C5 and a fourth dual bit memory cell 88 includes a first bit C6 and a second bit C7. The four dual bit memory cells could form an 8-bit word. A select gate 88 (Se10) and a select gate 90 (Sel1) are provided to enable reading, writing and erasing of the bits C0, C1 of dual bit memory 82 and bits C2 and C3 of dual bit memory 84. A select gate 92 (Se12) and a select gate 94 (Se13) are provided to enable reading, writing and erasing of the bits C4, C5 of dual bit memory 86 and bits C6 and C7 of dual bit memory 88. A first switch 96 is connected to a first bitline BL0, a second switch 98 is connected to a second bitline BL1 and a third switch 100 is connected to a third bitline BL2. The first, second and third switches couple the corresponding bitline between power (VDD) and ground (GND). Any bit of the dual bit memory cells can be read by providing different voltage configurations as illustrated in Table 2 below. In the example illustrated in FIG. 8, cell C0 of dual bit memory cell 82 is being read.

TABLE 2

| cell | WL | A | B | C | sel 0 | sel 1 | sel 2 | sel 3 | BL 0 | BL 1 | Bl 2 |
|---|---|---|---|---|---|---|---|---|---|---|---|
| C0 | Vgate | H | L | x | L | H | L | L | GND | VD | X |
| C1 | Vgate | L | H | x | L | H | L | L | VD | GND | X |
| C2 | Vgate | H | L | x | H | L | L | L | GND | VD | X |
| C3 | Vgate | L | H | x | H | L | L | L | VD | GND | X |
| C4 | Vgate | x | H | L | L | L | L | H | X | GND | VD |
| C5 | Vgate | x | L | H | L | L | L | H | X | VD | GND |
| C6 | Vgate | x | H | L | L | L | H | L | X | GND | VD |
| C7 | Vgate | x | L | H | L | L | H | L | X | VD | GND |

Figure 9:
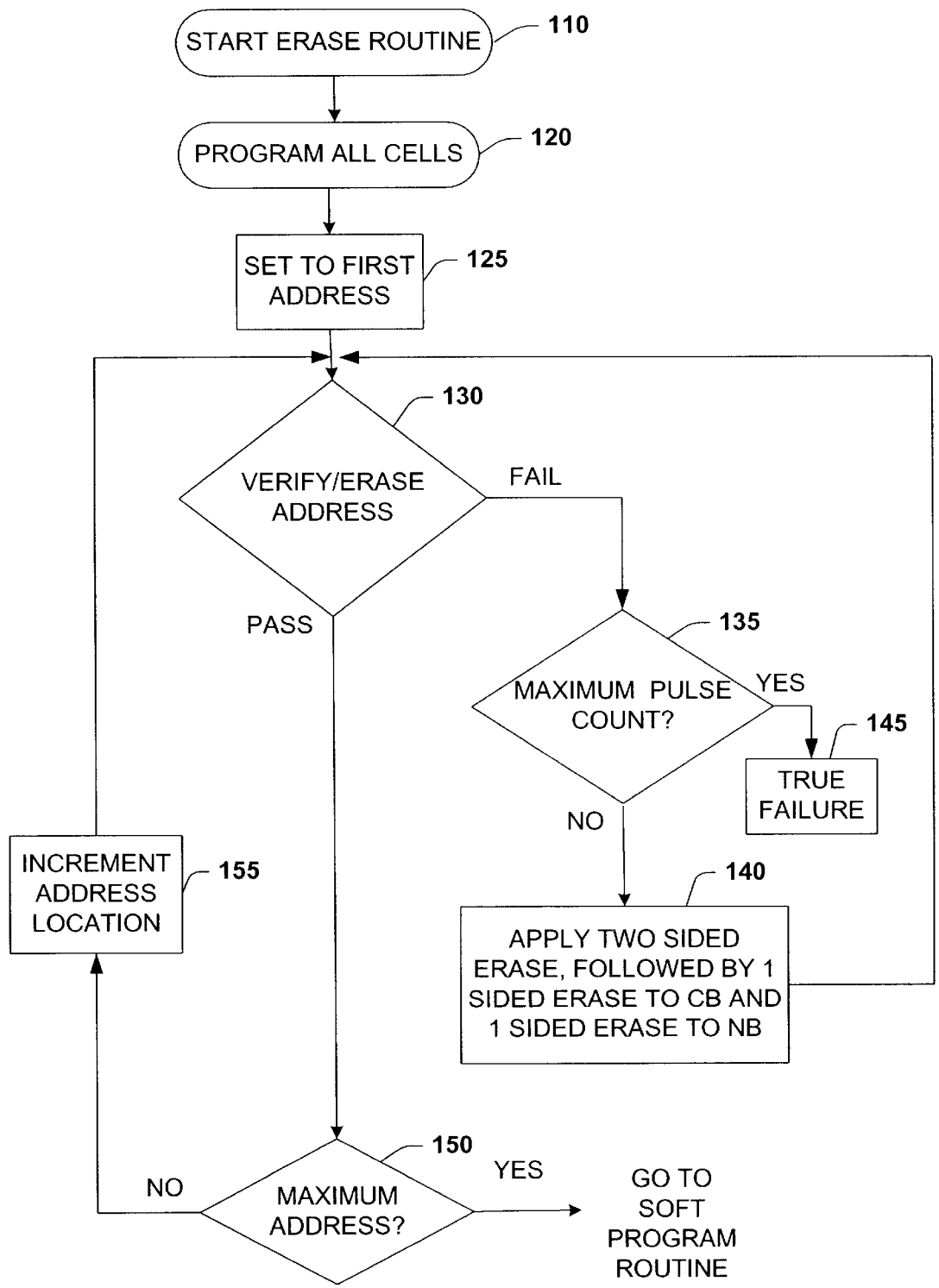
FIG. 9 is a flow diagram illustrating a methodology for erase verifying of an array of dual bit memory cells in accordance with an aspect of the invention.
Figure 10:
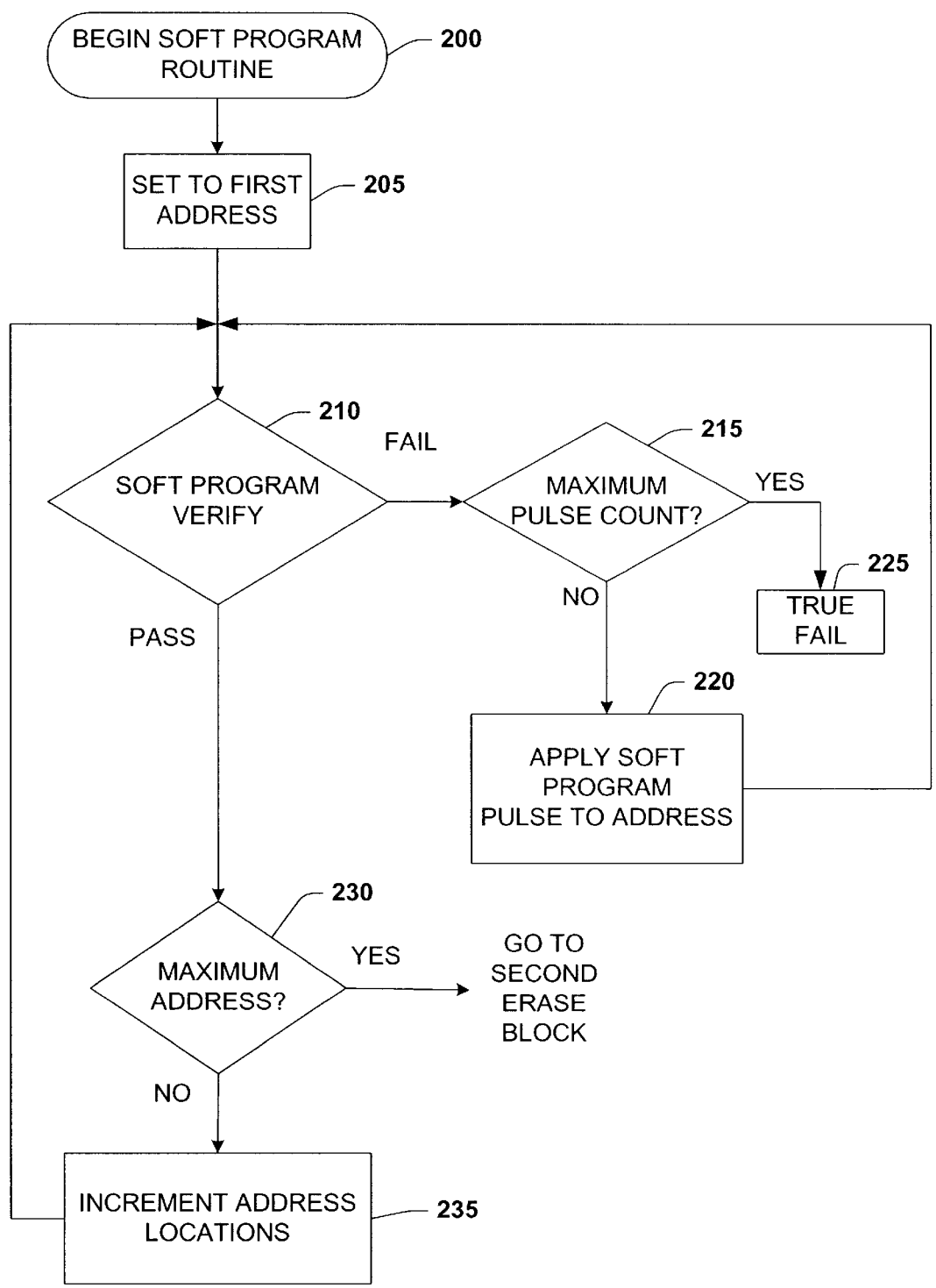
FIG. 10 is a flow diagram illustrating a methodology for soft programming of cells in the array of dual bit memory cells after the erasure verifying method of FIG. 9 in accordance with an aspect of the invention.
Figure 11:
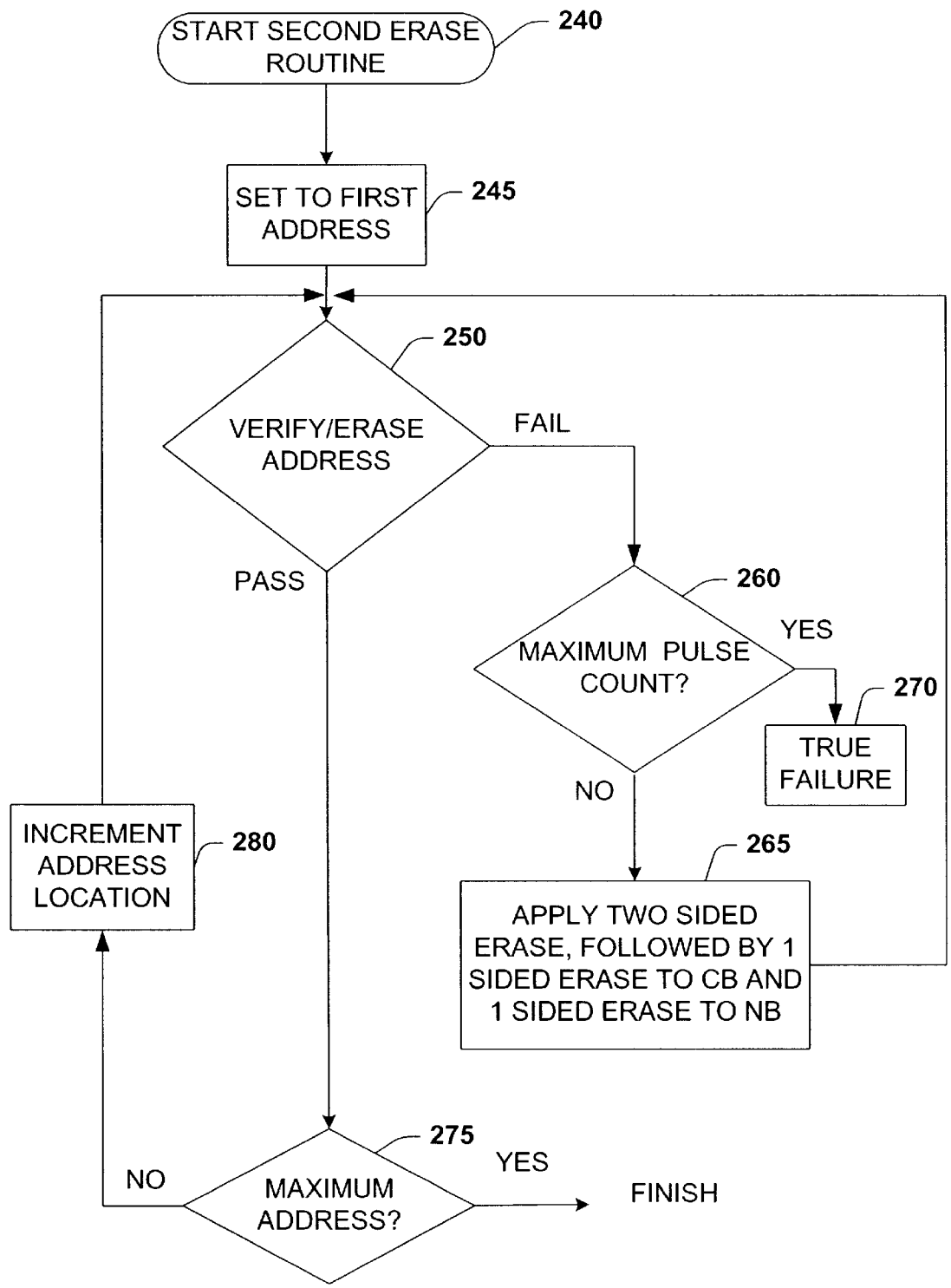
FIG. 11 is a flow diagram illustrating a methodology for verify erasure of cells in the array of dual bit memory cells after the soft programming method of FIG. 10 in accordance with an aspect of the invention.

In view of the structure described above with respect to FIGS. 1–8, a methodology for a double bit erase of dual bit memory cells in accordance with one aspect of the present invention may be better appreciated with respect to the flow diagrams of FIGS. 9–11. While, for purposes of simplicity of explanation, the methodology of FIGS. 9–11 are shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect the present invention.

The double bit erase methodology of FIGS. 9–11 includes a cell erase routine to control the upper and lower threshold limit of VT for a blank or erased condition (e.g., min VT=1.0V, max VT=1.8V) for both the complimentary and normal sides of each memory transistor. Furthermore, the double bit erase methodology includes a soft programming routine that controls the programming time by preventing over-erase of the cells which can lead to longer programming times. The soft programming can also impact the amount of charge loss after cycling. Finally the double bit erase routine may include a second erase to assure that any cells have not been programmed from the soft programming routine. The double bit methodology of FIGS. 9–11 improves the program and erase characteristics of the Flash memory array of the present invention operating during extended cycling (e.g., 100,000 program and erase (PE) cycles).

FIG. 9 illustrates an erase methodology utilizing hot hole injection near the high voltage drain junction for both the normal and complimentary bit. The process of heavy programming on one bit causes a build up of residual charge that cannot be reached during the single sided or classical erase over acceptable voltage levels and/or acceptable erase times. The double bit erase method ensures control of both the normal and complimentary bit blank VT by a verification and modified method erase with each cycle. Therefore, the double bit erase methodology applies a series of erase conditions or sequences during each pulse to both the complimentary bit(s) and its associated normal bit(s) within a single cell(s). The first erase sequence of each pulse is a two sided or two drain erase pulse which brings both the source and drain of all cell transistors to high voltage (e.g., 4–7 v). The complimentary bit and its associated normal bit is allowed to discharge. Then a single sided erase pulse is applied to the complimentary bit (e.g., complimentary drain goes to high voltage with the other transistor junction floated) followed by a single sided erase pulse to the normal bit (e.g., normal drain goes to high voltage with the other transistor junction floated). The order of the single sided pulses may be interchangeable regardless of the bit being verified. Significant improved results are achieved in the ONO double bit architecture when the two sided erase pulse is about 75%–95% of the total erase pulse time.

FIG. 9 illustrates one particular methodology for performing a programming and erase of a flash memory array having dual bit memory cells in accordance with one aspect of the present invention. The method begins at step 110 where the erase routine is invoked. The erase routine may be invoked, for example, by a command from a controller to a state machine residing on a flash device. Both the bits in normal column locations and complimentary column locations are programmed to a delta VT at step 120. The method then advances to step 125 where an address counter pointing to the memory address of the array is set to the first address. The methodology then proceeds to step 130. At step 130, the method performs a verify erase for an address location in a sector. The address location can be a memory address of a single bit location or a memory address of an I/O or word location of the sector. If the verify erase of the address location fails, the methodology proceeds to step 135. At step 135 the methodology determines if the maximum pulse count has been reached. If the maximum pulse count has been reached (YES), the methodology proceeds to step 145 where a true failure of the device is indicated. If the maximum pulse count has not been reached (NO), the methodology advances to step 140 to apply erase pulses.

At 140, the methodology applies a two sided erase pulse to both complimentary column and normal column locations of the sector for a duration of 8 to 12 ms (e.g., a 10 ms pulse). After a discharge time duration, a first single sided pulse is applied to the bits in the complimentary column location for a duration of 0.5 to 2 ms (e.g., 1 ms) followed by a second single sided pulse to bits in the normal column locations for a duration of 0.5 to 2 ms (e.g., 1 ms). The methodology then returns to step 130 for a verification of the erase of the current address location. If the verify erase of the current address locations passes, the methodology proceeds to step 150 to determine if the current bit or I/O address is the maximum address location. If the current cell or I/O address in not the maximum address location (NO), the address location of the address counter is incremented to the next address location at step 155. The method then returns to step 130 to perform a verification of the erase of the next address location. If the maximum address has been reached (YES) at step 150, the method advances to the soft program routine in FIG. 10 to ensure that the memory cells have not been over-erased.

A methodology of soft programming is utilized to control the minimum (over-erased) normal and complimentary bit VT's of a blank state after the erase methodology of FIG. 9. Over-erased cells are any VT under the minimum value for a blank state and are not classical column leakage bits. Although, it was not believed possible to store trapped holes in the nitride layer, the electrical fields used to erase the memory cells are very high and the local VT of the cells can be reduced below the natural state. When this occurs, the programming time for the over-erased cells will increase for one or both the normal bit and complimentary bit cells. Therefore, the soft programming methodology of FIG. 10 is performed to eliminate over-erased cells and maintain stable programming times during cycling.

FIG. 10 illustrates one particular methodology for performing soft programming of the flash memory array to ensure that the memory cells of the flash memory have not been over-erased. At step 200, the soft programming routine begins. The soft programming routine may be invoked, for example, by a command from a controller to a state machine residing on a flash device. Alternatively, the soft program routine may be part of the overall erase routine and begin after completion of the methodology of FIG. 9. The method then advances to step 205 where the address counter is set to the first address. The methodology then proceeds to step 210. At step 210, the method performs a verify of the soft program for the first address location. The verify should include a slight source voltage to repress any subthreshold leakage currents. If the verify soft program of the address location fails, the methodology proceeds to step 215 to determine if the maximum pulse count (e.g., 5 pulses) has been reached. If the maximum pulse count has been reached (YES), a true failure is indicated at step 225. If the maximum pulse count has not been reached (NO), the method advances to step 220 to apply a soft program pulse to the address location and returns to step 210 to verify if the address location has passed the soft programming verify condition. If the address location of the sector passes at step 210, the method proceeds to step 230 and determines if the maximum address of the sector has been reached. If the maximum sector address has not been reached (NO), the address location of the address counter is moved to the next address location at step 235 and the method returns to step 210 to repeat the steps of soft programming verify of the next address location in the memory array. If the maximum address location has been reached (YES) at step 230, the method advances to the second erase block of FIG. 11.

FIG. 11 illustrates one particular methodology for performing a second erase block of the flash memory array to ensure that the soft programming routine did not over program the memory cells in accordance with one aspect of the present invention. The method begins at step 240 at the second erase block. The second erase routine may be invoked, for example, by a command from a controller to a state machine residing on a flash device. Alternatively, the second erase routine may be part of the overall erase routine and begin after completion of the methodologies illustrated in FIGS. 9 and 10. The method then advances to step 245 where the address counter is set to the first address location. The methodology then proceeds to step 250. At step 250, the method performs a verify erase for an address location in a sector of the memory array. The address location can be a memory address of a single bit location or a memory address of an I/O or word location of the sector. If the verify erase of the address location fails, the methodology proceeds to step 260. At step 260 the methodology determines if the maximum pulse count has been reached. If the maximum pulse count has been reached (YES), the methodology proceeds to step 270 where a true failure of the device is indicated. If the maximum pulse count has not been reached (NO), the methodology advances to step 265 to apply erase pulses.

At 265, the methodology applies an erase pulse to both complimentary column locations and normal column locations of the sector for a duration of 8 to 12 ms (e.g., a 10 ms pulse). After a discharge time duration, a single sided pulse is applied to the bits in the complimentary column location for a duration of 0.5 to 2 ms (e.g., 1 ms) followed by a single sided pulse to bits in the normal column locations for a duration of 0.5 to 2 ms (e.g., 1 ms). The methodology then returns to step 255 for a verification of the erase of the current address location. If the verify erase of the current address locations passes, the methodology proceeds to step 275 to determine if the current bit or I/O address is the maximum address location. If the current cell or I/O address is not the maximum address location (NO), the address location of the address counter is incremented to the next address location at step 280. The method then returns to step 280 to perform a verification of the erase of the next address location. If the maximum address has been reached (YES) at step 265, the method is finished and the device returns to normal operation.

Another characteristic of the flash memory array employing dual bit memory cells is that the rows near sector select gates are very slow to erase. Additionally, the rows near the contacts show slower erase, but not as bad as those in the select gates. One method of mitigating this problem is to place dummy wordlines between blocks of memories (e.g., sectors), changing the wordline width for the last block or sector wordline, or using different nitride with less conductance in high temperature.

Figure 12:
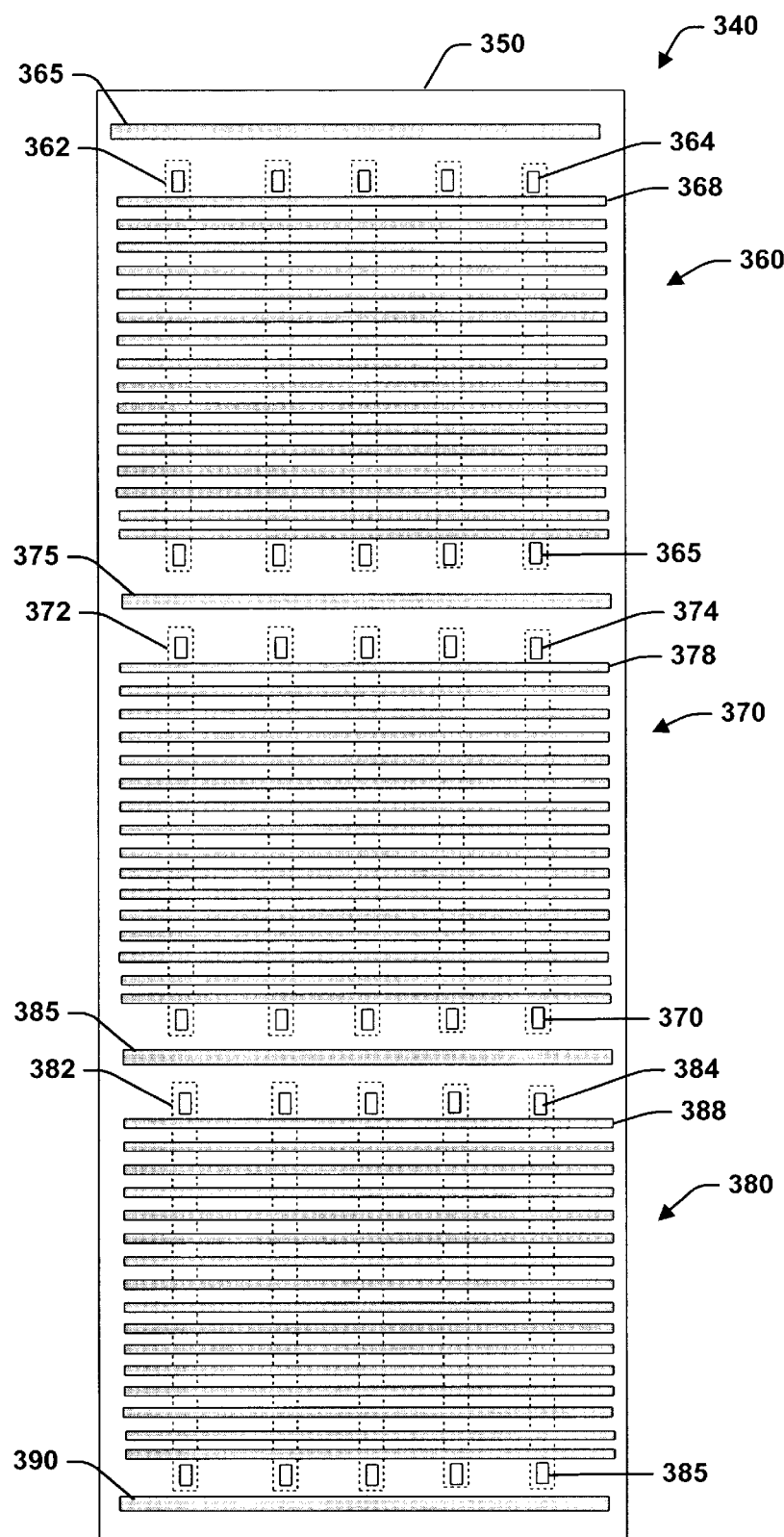
FIG. 12 illustrates a plan view of sectors of an array of dual bit flash memory having dummy wordlines residing between large gaps in the blocks of memory in accordance with the present invention.

FIG. 12 illustrates a structure and method of adding dummy wordlines between the blocks of memory cells. A portion of a flash memory array 340 is illustrated with a first sector 360, a second sector 370 and a third sector 380 formed in an ONO stack layer 350 containing a plurality of dual bit memory cells. Although the present example is illustrated with respect to sectors being formed from single blocks of 16 wordlines, it is to be appreciated that sectors are typically formed of several blocks of memory with contacts connecting to common metal bitlines and selection circuitry being provided between sectors. For example, blocks of 16 wordlines are typically used in a plurality to form a sector with 1 to 32 blocks. Therefore, the present example of FIG. 12 is for purposes of illustration and those skilled in the art would understand how to implement the present invention into a variety of different memory configurations.

The first sector 360 includes a plurality of wordlines 368 and a plurality of bitlines 362. Each bitline 362 includes a first contact 364 on a first end of the 16 wordlines 360 and a second contact 365 on a second end of the 16 wordlines 360. The second block of wordlines 370 includes a plurality of wordlines 378 and a plurality of bitlines 372. Each bitline 372 includes a first contact 374 on a first end of the block 370 and a second contact 375 on a second end of the block 370. The third sector 380 includes a plurality of wordlines 388 and a plurality of bitlines 382. Each bitline 382 includes a first contact 384 on a first end of the sector 380 and a second contact 385 on a second end of the sector 380. A first dummy wordline 365 is formed at the first end of the first 16 wordline block 360. A second dummy wordline 375 is placed between the first block 360 and the second wordline block 370. A third dummy wordline 375 is placed between the second block 370 and the third block 380 and a fourth dummy wordline 390 is placed at the second end of the third block 380.

The dummy wordlines are placed between the contacts, so that they can be programmed during a program and erase cycle. The dummy wordlines are ignored during the erase portion of the program and erase cycle. Eventually, the charge will dissipate until the next program and erase cycle. Although the dummy wordlines are illustrated between sectors, dummy wordlines should be provided between any edge wordline located near a gap where erase cycle time is effected. For example, blocks may be grouped together forming sectors and large gaps can be located between sectors instead of between blocks.

Figure 13:
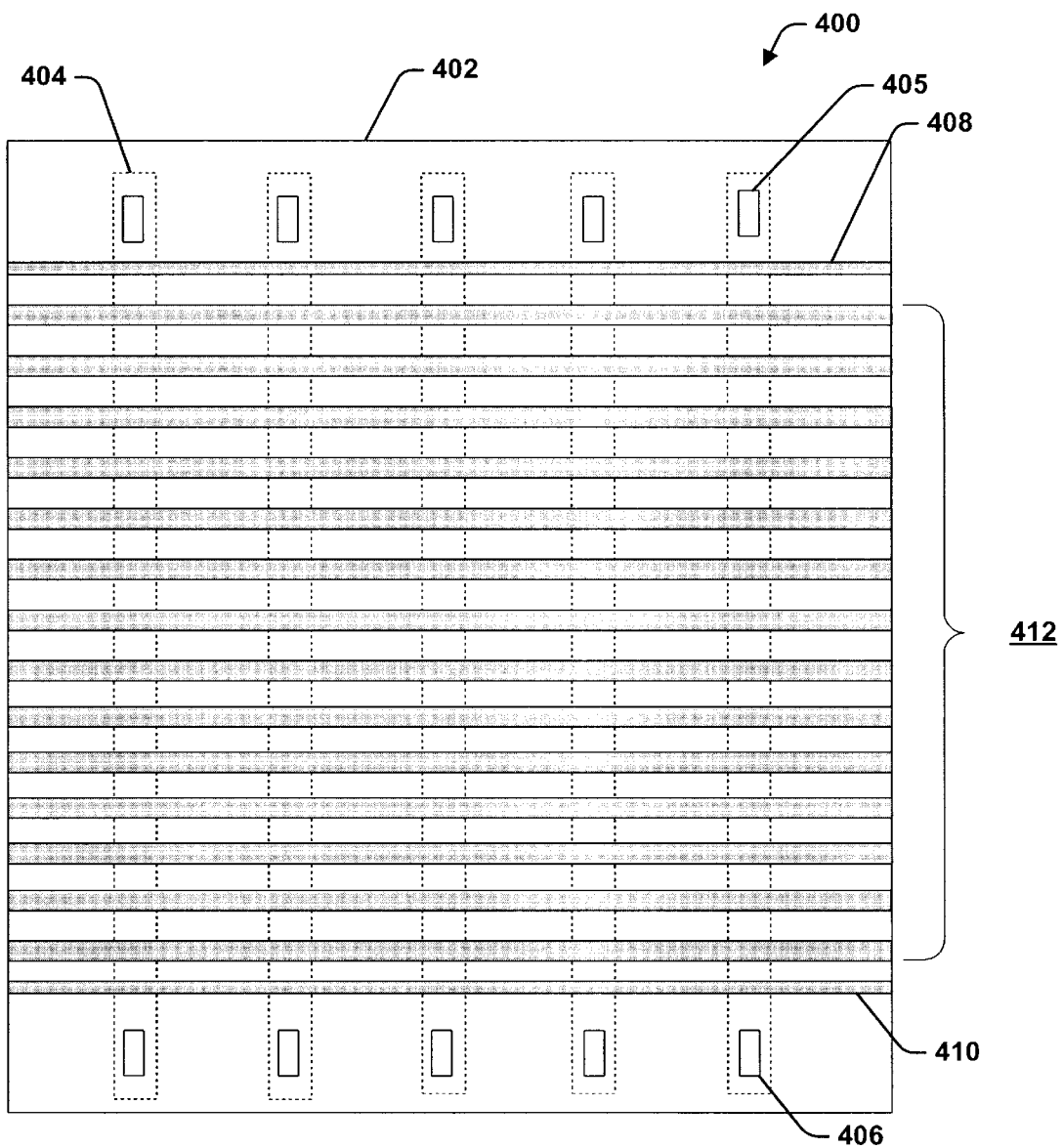
FIG. 13 illustrates a plan view of a sector of an array of dual bit flash memory having edge wordlines with a thickness that is less than a thickness of the remaining wordlines in accordance with the present invention.

FIG. 13 illustrates a structure and method of forming edge dummy wordlines that are thinner than the other wordlines in a block (or sector) of dual bit memory. Sixteen wordlines grouped in a block 400 is formed in an ONO stack layer 402 containing a plurality of dual bit memory cells adapted to operate in a single bit mode. The block 400 includes a plurality of wordlines 412 and a plurality of bitlines 404. Each bitline 404 includes a first contact 405 on a first end of the block 400 and a second contact 406 on a second end of the block 400. The block 400 includes a first edge wordline 408 on the first end of the block and a second edge wordline 410 on the second end of the block. The first and second edge wordlines 408 and 410 are fabricated with polysilicon and are formed with a width smaller than the remaining wordlines 412. The present example can also employ dummy wordlines. For example, the first edge wordline 408 and the second edge wordline 410 can be dummy wordlines with two additional wordlines added to the remaining wordlines 412 for a total of 16 remaining wordlines and 18 total wordlines. This type of dummy wordline should be programmed during a program and erase cycle.

Figure 14:
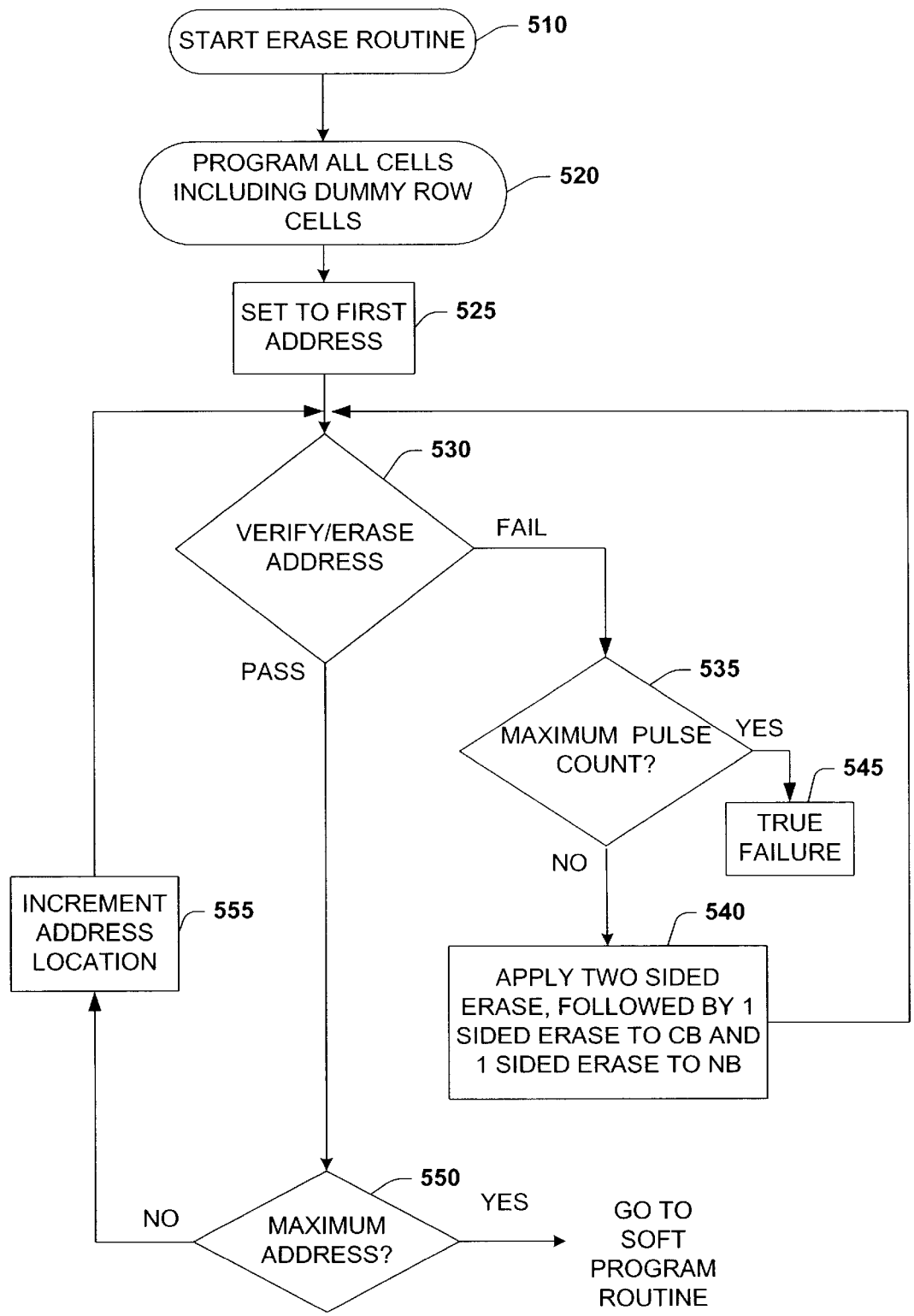
FIG. 14 is a flow diagram illustrating a methodology for erase verifying of an array of dual bit memory cells having dummy row memory cells in accordance with an aspect of the invention.

FIG. 14 illustrates one particular methodology for performing a programming and erase of a flash memory array having dual bit memory cells utilizing dummy wordlines in accordance with one aspect of the present invention. The method begins at step 510 where the erase routine is invoked. Both the bits in normal column locations and complimentary column locations of the array including the bits in the dummy wordlines are programmed to a delta VT at step 520. The method then advances to step 525 where an address counter pointing to the memory address of the array is set to the first address. The methodology then proceeds to step 530. At step 530, the method performs a verify erase for an address location in a sector. The address location can be a memory address of a single bit location or a memory address of an I/O or word location of the sector. If the verify erase of the address location fails, the methodology proceeds to step 535. At step 535 the methodology determines if the maximum pulse count has been reached. If the maximum pulse count has been reached (YES), the methodology proceeds to step 545 where a true failure of the device is indicated. If the maximum pulse count has not been reached (NO), the methodology advances to step 540 to apply erase pulses.

At 540, the methodology applies a two sided erase pulse to both complimentary column locations and normal column locations of the sector for a duration of 8 to 12 ms (e.g., a 10 ms pulse). After a discharge time duration, a first single sided pulse is applied to the bits in the complimentary column location for a duration of 0.5 to 2 ms (e.g., 1 ms) followed by a second single sided pulse to bits in the normal column locations for a duration of 0.5 to 2 ms (e.g., 1 ms). The methodology then returns to step 530 for a verification of the erase of the current address location. If the verify erase of the current address locations passes, the methodology proceeds to step 550 to determine if the current bit or I/O address is the maximum address location. If the current cell or I/O address in not the maximum address location (NO), the address location of the address counter is incremented to the next address location at step 555. The method then returns to step 530 to perform a verification of the erase of the next address location. If the maximum address has been reached (YES) at step 550, the method advances to the soft program routine in FIG. 10 to ensure that the memory cells have not been over-erased.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A method of erasing a dual bit memory cell having a normal bit and a complimentary bit associated with the normal bit, comprising:

applying a two sided erase pulse to both the normal bit and the complimentary bit; and applying a single sided erase pulse to at least one of the normal bit and the complimentary bit.

2. The method of claim 1, further comprising repeating the steps of applying the two sided and the single sided erase pulse until both the normal bit and associated complimentary bit are in a blank state.

3. The method of claim 1, the two sided ease pulse having a duration in the range of about 8 to about 12 ms and the single sided erase pulse having a duration in the range of about 0.5 to about 2 ms.

4. The method of claim 1, the two sided erase pulse having a duration that is about 75% to about 95% of an erase pulse time.

5. The method of claim 1, further comprising preprogramming the normal bit and complimentary bit to a delta VT prior to the step of applying the two sided erase pulse.

6. The method of claim 1, further comprising performing a step of verifying if the VT of at least one of the normal bit and complimentary bit is above a maximum allowable VT for a blank state prior to the step of applying the two sided erase pulse.

7. The method of claim 6, further comprising performing a step of verifying if the VT of at least one of the normal bit and complimentary bit is below a minimum allowable VT for a blank state and applying a soft program pulse to the at least one of the normal bit and complimentary bit if the at least one of the normal bit and complimentary bit is below the minimum allowable VT for a blank state.

8. The method of claim 7, further comprising performing a step of verifying if the VT of at least one of the normal bit and complimentary bit is above a maximum allowable VT for a blank state due to the applying of the soft program pulse and performing a second erase by repeating the steps of the two sided erase pulse and the single sided erase pulse if the VT of at least one of the normal bit and complimentary bit is above the maximum allowable VT for a blank state.

9. The method of claim 8, wherein the second erase comprises the two sided erase pulse having a duration in the range of about 8 to about 12 ms and the single sided erase pulse having a duration in the range of about 0.5 to about 2 ms.

10. The method of claim 1, the dual bit memory cell being formed from an ONO architecture.

11. A method for erasing an array of dual bit flash memory cells, each dual bit memory cell having a normal bit and a complimentary bit associated with the normal bit, the method comprising:
 applying a two sided erase pulse to bits in both normal column locations and complimentary column locations;
 applying a first single sided erase pulse to bits in one of normal column locations and complimentary column locations; and
 applying a second single sided erase pulse to bits in the other of normal column locations and complimentary column locations.

12. The method of claim 11, further comprising repeating the applying the two sided erase pulse, the first single sided erase pulse, and the second single sided erase pulse until bits in both the normal column locations and complimentary column locations are in a blank state.

13. The method of claim 11, the two sided erase pulse having a duration in the range of 8 to 12 ms and the first and second single sided erase pulses each having a duration in the range of 0.5 to 2 ms.

14. The method of claim 11, the two sided erase pulse having a duration that is about 75 to 95% of an erase pulse time.

15. The method of claim 11, further comprising preprogramming bits in the normal column locations and complimentary column locations to the delta VT prior to the step of applying the two sided erase pulse.

16. The method of claim 15, further comprising preprogramming bits in the normal column locations and complimentary column locations of at least one dummy wordline residing adjacent at least one block of memory to the delta VT prior to the step of applying the two sided erase pulse.

17. The method of claim 11, further comprising verifying if a VT of at least one bit in at least one of the normal column locations and the complimentary column locations is above a maximum allowable VT for a blank state prior to applying the two sided erase pulse.

18. The method of claim 17, further comprising repeating the verifying for each address location in the memory array and applying the two sided erase pulse, the first single sided erase pulse and the second single sided erase pulse until each bit in the memory array has a VT below the maximum allowable VT for a blank state.

19. The method of claim 18, further comprising verifying if the VT of the at least one bit in the at least one of the normal column locations and the complimentary column locations is below a minimum allowable VT for a blank state and applying a soft program pulse to the at least one bit if the at least one bit is below the minimum allowable VT for a blank state.

20. The method of claim 19, further comprising verifying if the VT of the at least one bit is above the maximum allowable VT for a blank state due to the applying of the soft program pulse and performing a second erase by repeating the applying the two sided erase pulse, the first single sided erase pulse, and second single sided erase pulse if the VT of the at least one bit is above the maximum allowable VT for a blank state.

21. The method of claim 20, wherein the second erase comprises the two sided erase pulse having a duration in the range of about 8 to about 12 ms and the first single sided erase pulse and the second single sided erase pulse each having a duration in the range of about 0.5 to about 2 ms.

22. The method of claim 11, the dual bit memory cell being formed from an ONO architecture.

23. The method of claim 11, the normal bit location and associated complimentary bit location being a single dual bit cell.

24. The method of claim 11, the normal bit location and associated complimentary bit location being a single word of dual bit cells.

25. A system for erasing an array of dual bit flash memory, each dual bit memory cell having a normal bit and a complimentary bit associated with the normal bit, the system comprising:
 an array of dual bit flash memory cells;
 an address decoder component coupled to the array of dual bit flash memory cells, the address decoder component being adapted to provide access to the normal bit and the complimentary bit of each of the dual bit flash memory cells;
 a voltage generator adapted to provide appropriate voltages for performing programming and erasure of the normal bits and the complimentary bits of the dual bit flash memory cells; and
 a command logic component including a state machine, the command logic and state machine being coupled to the array and the address decoder component and being operable to control the voltage generator, the command logic component and the state machine being adapted to receive an erase command and execute an erase algorithm that applies a two sided erase pulse to bits in both normal column locations and complimentary column locations then applies a first single sided erase pulse to the complimentary bit in one of normal column locations and complimentary column locations and then applies the second single sided erase pulse to the normal bit in the other of normal column locations and complimentary column locations.

26. The system of claim 25, the command logic component and state machine component being operable to repeat the applying the two sided erase pulse, the first single sided erase pulse, and the second single sided erase pulse until the normal bits and the complimentary bits in both the normal column locations and complimentary column locations are in a blank state.

27. The system of claim 25, the two sided erase pulse having a duration in the range of about 8 to about 12 ms and the first single sided erase pulse and the second single sided erase pulse each having a duration in the range of about 0.5 to about 2 ms.

28. The system of claim 25, tie two sided erase pulse having a duration that is about 75% to about 95% of an erase pulse time.

29. The system of claim 25, the command logic component and state machine component being operable to preprogram bits via the voltage generator in the normal column locations and complimentary column locations to a delta VT prior to applying the two sided erase pulse, the first single sided erase pulse, and the second single sided erase pulse.

30. The system of claim 29, the command logic component and state machine component being further operable to preprogram bits via the voltage generator in the normal column locations and complimentary column locations of at least one dummy wordline residing adjacent at least one block of memory to the delta VT prior to applying the two sided erase pulse, the first single sided erase pulse, and the second single sided erase pulse.

31. The system of claim 25, the command logic component and state machine component being operable to verify if a VT of at least one bit in at least one of the normal column locations and the complimentary column locations is above a maximum allowable VT for a blank state prior to applying the two sided erase pulse, the first single sided erase pulse, and the second single sided erase pulse.

32. The system of claim 31, the command logic component and state machine component being operable to repeat verification for each address location in the memory array and apply the two sided erase pulse, the first single sided erase pulse and the second single sided erase pulse until each bit in the memory array has a VT below the maximum allowable VT for a blank state.

33. The system of claim 32, the command logic component and state machine component being operable to verify if the VT of the at least one bit in at least one of the normal column locations and complimentary column locations is below a minimum allowable VT for a blank state and apply a soft program pulse via the voltage generator to the at least one bit if the at least one bit is below the minimum allowable VT for a blank state.

34. The system of claim 33, the command logic component and state machine component being operable to determine if the VT of the at least one bit is above the maximum allowable VT for a blank state due to the application of the soft program pulse and perform a second erase by repeating the steps of applying the two sided erase pulse, the first single sided erase pulse, and second single sided erase pulse if the VT of the at least one bit is above the maximum allowable VT for a blank state.

35. The system of claim 34, wherein the second erase comprises the two sided erase pulse having a duration in the range of about 8 to about 12 ms and the first single sided erase pulse, and the second single sided erase pulse each having a duration in the range of about 0.5 to about 2 ms.

36. The system of claim 25, the dual bit memory cell being formed from an ONO architecture.

37. The system of claim 25, the normal bit location and associated complimentary bit location being a single dual bit cell.

38. The system of claim 25, the normal bit location and associated complimentary bit location being a single word of dual bit cells.

39. A system for erasing dual bit flash memory cells, each dual bit memory cell having a normal bit and a complimentary bit associated with the normal bit, the system comprising:

means for programming the normal bits and complimentary bits in normal column locations and complimentary column locations;

means for applying a set of erase pulses to the normal bits and complimentary bits in normal column locations and complimentary column locations, the set of erase pulses comprising a two sided erase pulse to both the normal bits and complimentary bits in normal column locations and the normal bits and complimentary bits in complimentary column locations followed by a first single sided erase pulse to the complimentary bits in one of normal column locations and complimentary column locations and a second single sided erase pulse to the normal bits in the other of normal column locations and complimentary column locations.

40. The system of claim 39, further comprising means for determining that the normal bits and complimentary bits in the normal column locations and the complimentary column locations are properly erased and means for selectively soft programming the normal bits and complimentary bits in the normal column locations and the complimentary column locations if any of the normal bits and complimentary bits are over-erased.

41. The system of claim 40, further comprising means for determining if any of the normal bits and complimentary bits have been programmed by the means for selectively soft programming and the means for applying a second set of erase pulses if the means for selectively soft programming has caused any of the normal bits and complimentary bits to be programmed.

* * * * *